US009608731B2

(12) United States Patent
Gudeman (10) Patent No.: US 9,608,731 B2
(45) Date of Patent: Mar. 28, 2017

(54) MICROFABRICATED OPTICAL APPARATUS (71) Applicant: Innovative Micro Technology, Goleta, CA (US)

(72) Inventor: Christopher S. Gudeman, Lompoc, CA (US)

(73) Assignee: Innovative Micro Technology, Goleta, CA (US)

( * ) Notice: Subject to any disclaimer, the term of this patent is extended or adjusted under 35 U.S.C. 154(b) by 21 days.

(21) Appl. No.: 14/931,883

(22) Filed: Nov. 4, 2015

(65) Prior Publication Data

US 2016/0126696 A1 May 5, 2016

Related U.S. Application Data

(60) Provisional application No. 62/075,753, filed on Nov. 5, 2014.

(51) Int. Cl.
| | |
|---|---|
| *H04B 10/516* | (2013.01) |
| *H01S 5/022* | (2006.01) |
| *G02B 27/09* | (2006.01) |
| *H01S 5/00* | (2006.01) |
| *H01S 5/40* | (2006.01) |

(52) U.S. Cl.
CPC ....... *H04B 10/516* (2013.01); *G02B 27/0955* (2013.01); *H01S 5/02248* (2013.01); *H01S 5/02292* (2013.01); *H01S 5/02296* (2013.01); *H01S 5/0064* (2013.01); *H01S 5/02216* (2013.01); *H01S 5/02288* (2013.01); *H01S 5/4025* (2013.01)

(58) Field of Classification Search
CPC ............. H01S 5/02276; H01S 5/02292; H01S 5/0267; G02B 27/0955; G02F 1/093; H04B 10/516
See application file for complete search history.

(56) References Cited

U.S. PATENT DOCUMENTS

| | | | | |
|---|---|---|---|---|
| 2009/0198125 | A1* | 8/2009 | Nakabayashi | A61B 5/0066 600/425 |
| 2012/0026503 | A1* | 2/2012 | Lewandowski | G01N 21/4795 356/477 |
| 2015/0185426 | A1* | 7/2015 | Miao | G02F 1/093 385/33 |

* cited by examiner

*Primary Examiner* — Fernando L Toledo
*Assistant Examiner* — Neil Prasad
(74) *Attorney, Agent, or Firm* — Jaquelin K. Spong (57) ABSTRACT

A microfabricated optical apparatus that includes a light source driven by a waveform, a turning mirror, and a beam shaping element, wherein the waveform is delivered to the light source by at least one through silicon via.

6 Claims, 8 Drawing Sheets

MICROFABRICATED OPTICAL APPARATUS

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to integrated circuit and microelectromechanical systems (MEMS) devices. More particularly, this invention relates to a microfabricated optical apparatus wherein vias are formed completely through the silicon substrates.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to switch electrical signals. Because of its small size and fragile structure, the movable cantilever may be enclosed in a cavity to protect it and to allow its operation in an evacuated environment. Therefore, upon fabrication of the moveable structure on a wafer, (device wafer) the device wafer may be mated with a lid wafer, in which depressions have been formed to allow clearance for the structure and its movement. To maintain the vacuum over the lifetime of the device, a getter material may also be enclosed in the device cavity upon sealing the lid wafer against the device wafer. If a vacuum is not needed, the getter can be omitted and cavity can be filled with an inert gas such as Ar of N2.

One such device that may be manufactured using MEMS techniques is a microfabricated optical table. Microfabricated optical tables may include very small optical components which may be arranged on the surface of a substrate in a manner analogous to a macroscopic optical components mounted on a full sized optical bench. These microfabricated components may include light sources such as light emitting diodes (LED's), solid state lasers (SSL), beam shaping structures such as lenses and turning mirrors, and polarization altering devices such as Faraday rotators and optical isolators.

After fabrication, these devices may be enclosed with a lid wafer to protect them in an encapsulated device cavity. Some devices, such as infrared detectors and emitters, may require a vacuum or low moisture environment, such that the device cavity may need to be substantially hermetically sealed.

In order to control such a microfabricated elements, electrical access must be provided that allows power and signals to be transmitted to and from the elements. Previously, these signal lines were routed under the bond lines between the lid wafer and the device wafer. Because the enclosed elements may be delicate, the bondlines may be, for example, metal alloy bondlines that are activated at relatively low processing temperatures. However, the presence of the flat metal bondlines directly adjacent to potentially high frequency signal lines may cause unwanted capacitance in the structure, limiting its high speed performance.

Accordingly, encapsulated microfabricated high frequency optical structures have posed an unresolved problem.

SUMMARY

A method is described which can be used to make microfabricated optical tables using conductive vias which extend through the thickness of the substrate material.

A feature of this process is that conductive vias may be formed in a relatively insulative surrounding material of the substrate. These vias may supply power and signals to/from the components inside a substantially hermetically sealed device cavity. The signal and power lines may be delivered to the sealed device cavity with a through substrate via (TSV). The TSV may have a bonding pad on one side of the substrate, and a conductive line leading to the device within the device cavity. Accordingly, this architecture avoids the large capacitive losses that may occur with the under-bond routing of these electrical leads.

The encapsulated components may include turning mirrors, optical rotators and isolators, light emitters and optical lenses. Using this architecture, the turning mirror may be a reflective surface formed on a surface of the lid wafer, or it may be a separate component formed or attached on the device wafer surface.

Numerous devices can make use of the systems and methods disclosed herein. In particular, high speed, compact telephone or communications switching equipment may make use of this architecture. RF switches benefit from the reduced capacitive coupling that an insulative substrate can provide. High density vias formed in the insulative substrate increase the density of devices which can be formed on a substrate, thereby reducing cost to manufacture. Other sorts of substrates, for example, metal or semiconducting substrates may make use of an insulating layer to provide isolation between the conductive via and the surrounding substrate. The performance of such devices may also be improved, in terms of insertion loss, distortion and isolation figures of merit.

Accordingly, the microfabricated optical apparatus fabricated on a substrate, may include a light source driven by a signal, wherein the light source generates optical radiation, a beam shaping element, and a turning surface which redirects the beam of light, wherein the signal is delivered to the light source by at least one through silicon via (TSV) which extends through a thickness of the substrate. The systems and methods may include elements of wafer level packaging (WLP), wafer bonding, pick and place mechanisms, MEMS processes, methods, structures and actuators.

The method for fabricating an optical apparatus on a substrate may include forming a device cavity in a lid wafer, forming a through silicon via through the substrate, disposing a light source driven by a waveform which generates optical radiation on the substrate, and coupling the light source electrically to the through silicon via, disposing a beam shaping element on the substrate, disposing a turning surface which redirects the beam of light, and bonding the substrate to the lid wafer to encapsulate the optical apparatus in a substantially hermetic device cavity.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to microfabricated optical tables, wherein small optical devices are formed on a substrate surface and enclosed with a lid wafer. The optical devices may include light sources such as light emitting diodes (LED's) or solid state lasers (SSL's), beam shaping structures such as lenses and turning mirrors, and polarization altering devices such as Faraday rotators and optical isolators.

After fabrication, these devices may be enclosed with a lid wafer to protect them in an encapsulated device cavity. Some devices, such as optical detectors and optical or laser emitters, may require a vacuum or low moisture environment, such that the device cavity may need to be substantially hermetically sealed. The signal and power lines may be delivered to the sealed device cavity with a through substrate via (TSV). The TSV may have a bonding pad on one side of the substrate, and a conductive line leading to the device within the device cavity.

Through substrate vias may be particularly convenient for MEMS devices, because they may allow electrical access to the encapsulated devices. Without such through holes, electrical access to the MEMS device may have to be gained by electrical leads routed under the lid wafer which is then substantially hermetically sealed. It may be problematic, however, to achieve a substantially hermetic seal over terrain that includes the electrical leads unless more complex and expensive processing steps are employed. This approach also makes radio-frequency applications of the device limited, as electromagnetic coupling will occur from the metallic bondline residing over the normally oriented leads. "Substantially hermetic" is used herein, should be understood to provide a barrier against moisture penetration, and/or capable of maintaining vacuum to within about the 10 Torr range.

The systems and methods described herein may be particularly applicable to vacuum encapsulated optical tables, such as an LED, shaping lens, rotator/isolator and turning mirror, all enclosed in the device cavity.

Figure 1:
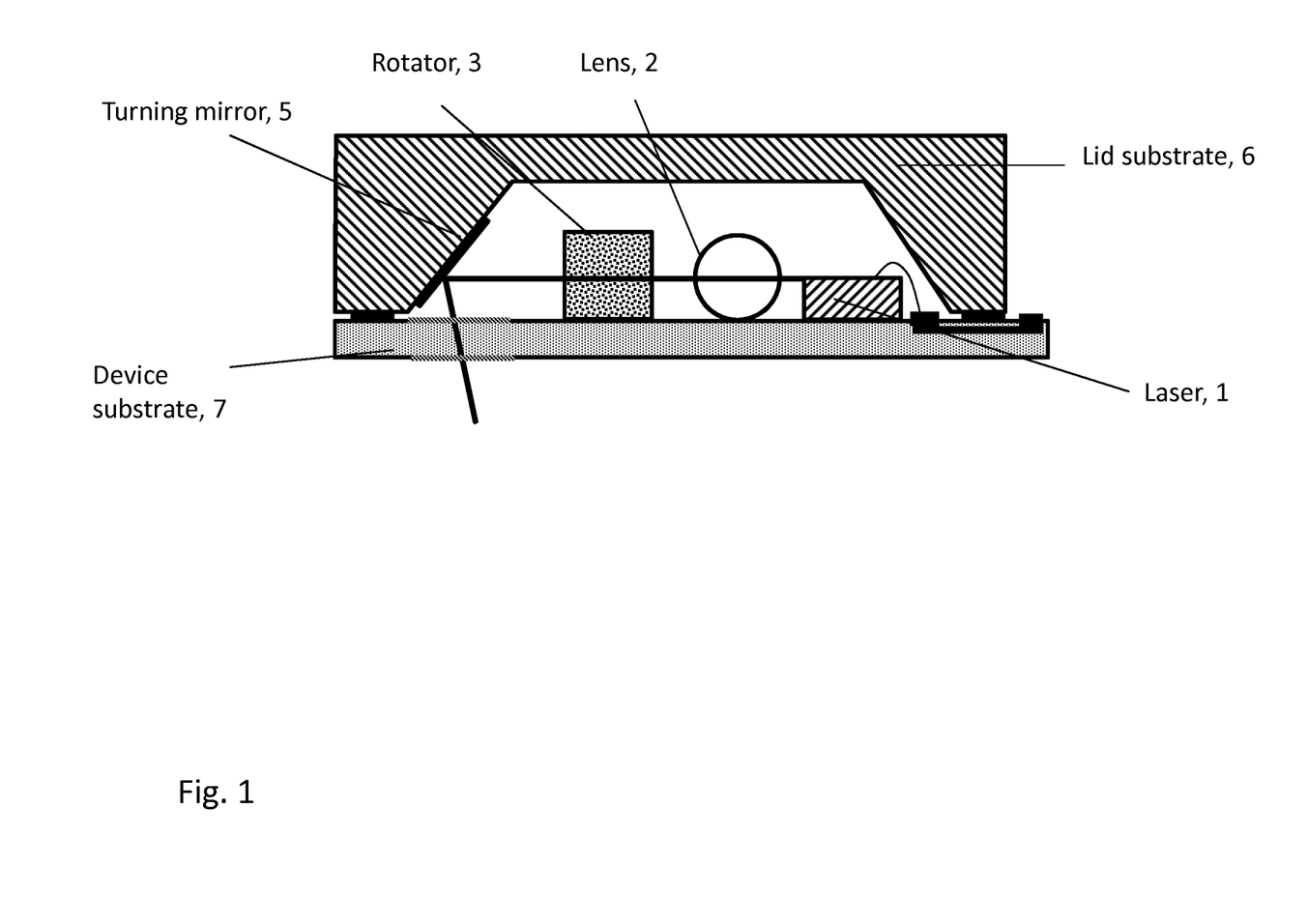
FIG. 1 is a schematic illustration of a prior art microfabricated optical apparatus.

The prior art is illustrated in FIG. 1, and exemplary embodiments of the novel optical apparatuses are illustrated in FIGS. 2-8.

FIG. 1 shows a prior art example of a microfabricated optical table. As can be seen in FIG. 1, the output of laser light source 1 may be shaped by a ball lens 2 and then through Faraday rotator 3. A Faraday rotator 3 is an optical device that rotates the polarization of light due to the Faraday effect, which in turn is based on a magneto-optic effect. The Faraday rotator 3 in combination with a quarter wave plate outside the cavity, may provide optical isolation. The beam of light then impinges on a turning mirror 5 which redirects the light in a direction normal to the substrate, shown downward in FIG. 1. The light may pass through the device substrate 7 on which the aforementioned devices are fabricated. In FIG. 1, the turning mirror is a discrete structure 5, encapsulated in the device cavity along with the other components.

One of the problems with the device shown in FIG. 1 is that the leads that drive the laser emitter are necessarily routed under the bond lines that bond the lid wafer 6 to the device wafer 7. Accordingly, a large capacitive coupling may occur, with commensurately large losses especially at high frequencies. Although the device shown in FIG. 1 may be smaller and lower cost than a TO-can packaging with ceramic carrier, the performance of the device may suffer from the aforementioned capacitive coupling, especially at higher frequencies.

Figure 2:
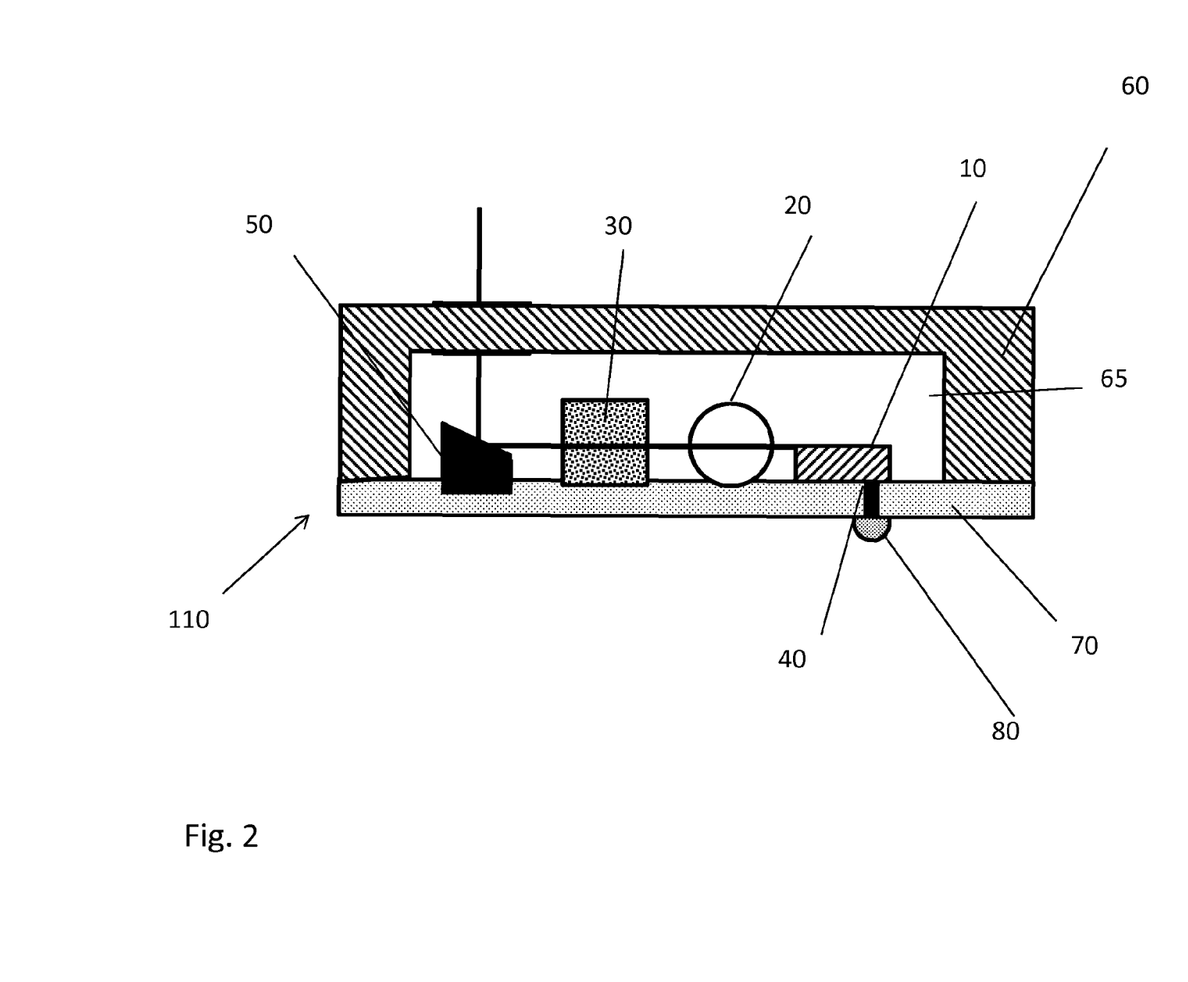
FIG. 2 is a schematic, cross sectional illustration of a first embodiment of a microfabricated optical apparatus.

FIG. 2 shows a first embodiment of the systems and methods disclosed here. In FIG. 2, there may be a laser light source 10 which produces a beam of light which may be shaped by a ball lens 20 and then through Faraday rotator 30. The beam of light then impinges on a turning surface 50 which redirects the light in a direction normal to the substrate, shown upward in FIG. 2. The light may pass through the lid substrate 60 which may encapsulate the aforementioned devices disposed on the device substrate 70. In FIG. 2, the turning surface is a turning mirror 50, which is a discrete structure, encapsulated in the device cavity along with the other components.

Suitable materials for the device substrate 70 and lid substrate 60 may be a metal or semiconductor such as silicon, or a ceramic or glass. The device cavity 65 may be etched into the lid wafer 60 using, for example, deep reactive ion etching (DRIE). The depth of the device cavity may be several hundred microns and have sufficient lateral extent to easily cover the components shown in FIGS. 2-8. Accordingly, the aforementioned components, including turning mirror 50, rotator 30, lens 20 and light source 10 may be disposed in the device cavity 65, such that the device cavity 65 encloses and encompasses the optical apparatus 110.

The laser 10 may be a light emitting laser diode for example, that can be driven by power and signal lines which are delivered to the laser 10 by one or more through silicon vias (TSVs) 40. These vias 40 are formed through the thickness of the device wafer 70. A number of references describe methods for making such through wafer vias 40. In the embodiment shown in FIG. 2, a discrete turning mirror 50 directs the beam of light from the laser 10, ball lens 20 and Faraday rotator 30 to a direction normal to the substrates. The beam of light may exit through the lid substrate 60.

This embodiment may make use of, for example, a single mode, distributed feedback (DFB) edge-emitting laser located within the device cavity, and thereby protected from the environment and moisture by a substantially hermetic seal. The single mode, edge emitting diode may be capable of higher data rates than a multimode vertical cavity surface emitting lasers (VCSELs), such that this embodiment may have both performance and cost advantages. The DFB laser may be modulated directly by a signal or waveform fed to the DFB laser through the through silicon via, or it may be driven by a direct current (DC) electrical signal applied to the TSV. However, it should be understood that the light source 10 may be at least one of a light emitting diode, a laser diode, an edge emitting laser diode, and a vertical cavity surface emitting laser. The electrical access to the TSV 40 may be provided by a bonding pad 80, to which macroscopic electrical connections may be made. In the embodiments shown in FIG. 2, because the light is emitted through the lid substrate and thus on the obverse side compared to the electrical connections, this embodiment may be particularly convenient for coupling to a printed circuit board or thin film circuit.

Figure 3:
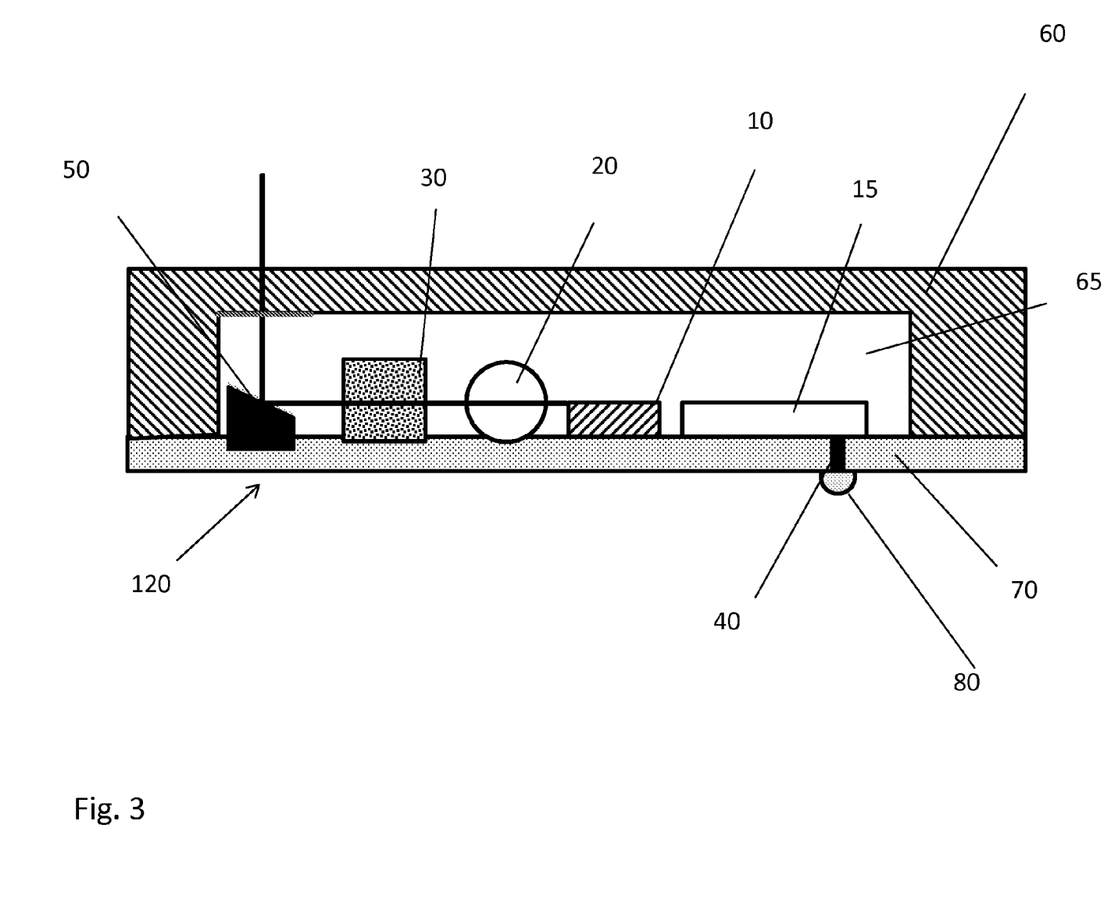
FIG. 3 is a schematic, cross sectional illustration of a second embodiment of a microfabricated optical apparatus.

FIG. 3 shows another embodiment of the MEMS silicon optical apparatus. This second embodiment is similar to that shown in FIG. 2, except that in this embodiment, there is also a driver 15 that drives the laser 10 with a particular pattern or modulation that may represent data to be communicated over the optical link. Like the previous embodiment, there is once again a laser light source 10, which produces a beam of light which may be shaped by a ball lens 20, and then rotated by a Faraday rotator 30. The beam of light then impinges on a turning surface 50 which redirects the light in a direction normal to the substrate, shown as upward in FIG. 4. The light may pass through the lid substrate 60 which encapsulates the aforementioned devices disposed on the device substrate 70. In FIG. 3, the turning surface is a turning mirror 50, which is a discrete structure, encapsulated in the device cavity along with the other components. As in the previous embodiment, the laser is driven by through substrate vias 40, which may improve the high frequency characteristics of the device. The electrical access to the TSV may be provided by a bonding pad 80, to which macroscopic electrical connections may be made. In the embodiments shown in FIG. 3, because the light is emitted through the lid substrate and thus on the obverse side compared to the electrical connections, this embodiment may be particularly convenient for coupling to a printed circuit board or thin film circuit. In the embodiment shown in FIG. 3, the TSVs may conduct a direct current (DC) signal to the driver 15, which then modulates the signal to encode information thereon. Accordingly, this embodiment may include the power driver inside the substantially hermetic package, and the close proximity of the compact device cavity provides for better RF performance and reduced power consumption. Therefore, the microfabricated optical apparatus may further comprise a device which modulates at least one of a frequency and an amplitude, to encode the optical radiation emitted from the light source with an information signal.

Otherwise, the embodiment shown in FIG. 3 may be similar to that shown in FIG. 2, and the turning mirror 50 may direct the optical radiation to exit the device cavity through a roof of the lid wafer, in a substantially parallel direction relative to the through silicon via.

Figure 4:
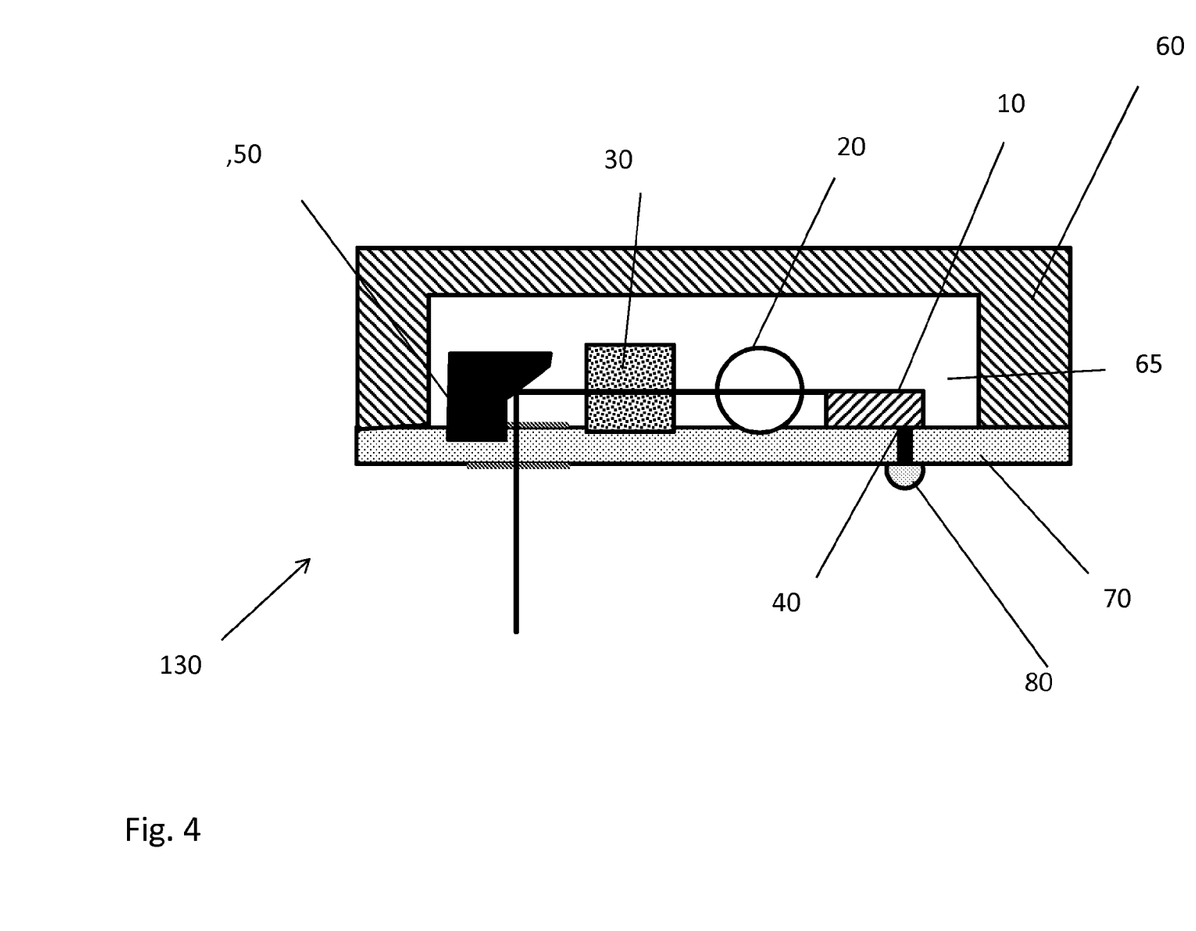
FIG. 4 is a schematic, cross sectional illustration of a third embodiment of a microfabricated optical apparatus.

FIG. 4 shows a third embodiment, wherein the turning mirror 50 directs the beam of light downward through the device substrate 70 rather than upward through the lid wafer 60. As in the previous embodiments, the laser may be driven by through substrate vias 40, which may improve the high frequency characteristics of the device. The output of this embodiment may be generally downward on the same side of the device as the electrical connections are made. Accordingly, in contrast to the embodiment shown in FIGS. 2 and 3, the optical apparatus in FIG. 4 has a turning mirror 50 which may bend the optical radiation to exit the device cavity through the device substrate 70, in a substantially parallel direction relative to the through silicon via.

Figure 5:
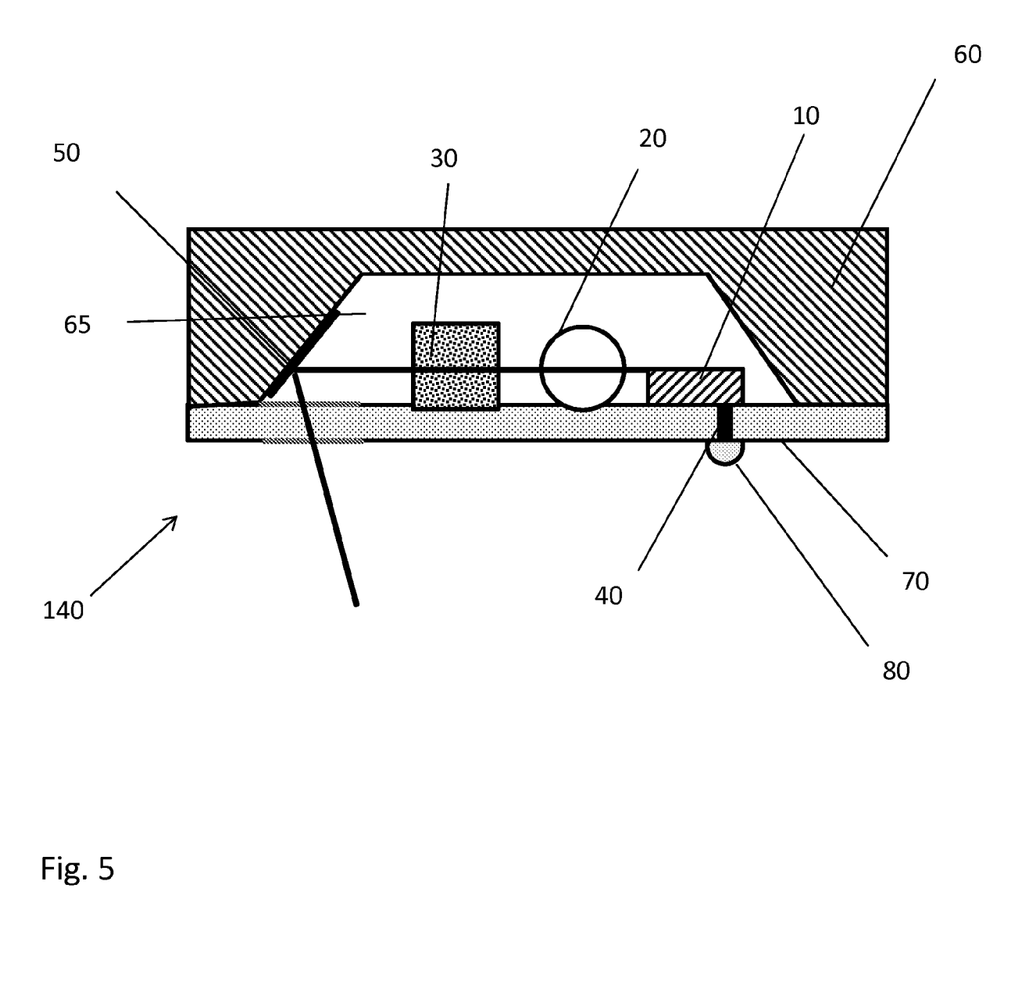
FIG. 5 is a schematic, cross sectional illustration of a fourth embodiment of a microfabricated optical apparatus.

FIG. 5 shows a fourth embodiment of the MEMS silicon optical apparatus, wherein the turning surface 50' is formed by a reflective surface on the lid wafer. This surface may be formed by anisotropic etching, followed by the deposition of a reflective coating on the lid wafer 60 surface. The reflective surface may be a thin film of gold (Au) or silver (Ag) or it may be a multilayer film with layer thicknesses designed to enhance reflectivity of the particular wavelength.

As in the previous embodiments, there is once again a laser light source 10, which produces a beam of light which may be shaped by a ball lens 20, and then rotated by a Faraday rotator 30. The beam of light then impinges on a turning surface 50' which redirects the light through the substrate, shown as generally downward in FIG. 5. The light may pass through the device substrate 70 on which the aforementioned devices are fabricated, in a non-normal (with respect to the substrate). As in the previous embodiments, the laser may be driven by through substrate vias 40, which may improve the high frequency characteristics of the device. The device may have the advantage of simpler fabrication. Accordingly, in some embodiments, the microfabricated optical apparatus may generate optical radiation which exits the device cavity 65 through a sidewall of the device cavity 65 in the lid wafer 60, at an angle with respect to the through silicon via. In this case, the turning surface may be a reflective film deposited on a sidewall of the device cavity, wherein the sidewall is inclined with respect to a surface of the substrate by about 50 to 60 degrees. The turning surface may be a reflective film deposited on an inclined surface of an optical element located within the device cavity.

Figure 6:
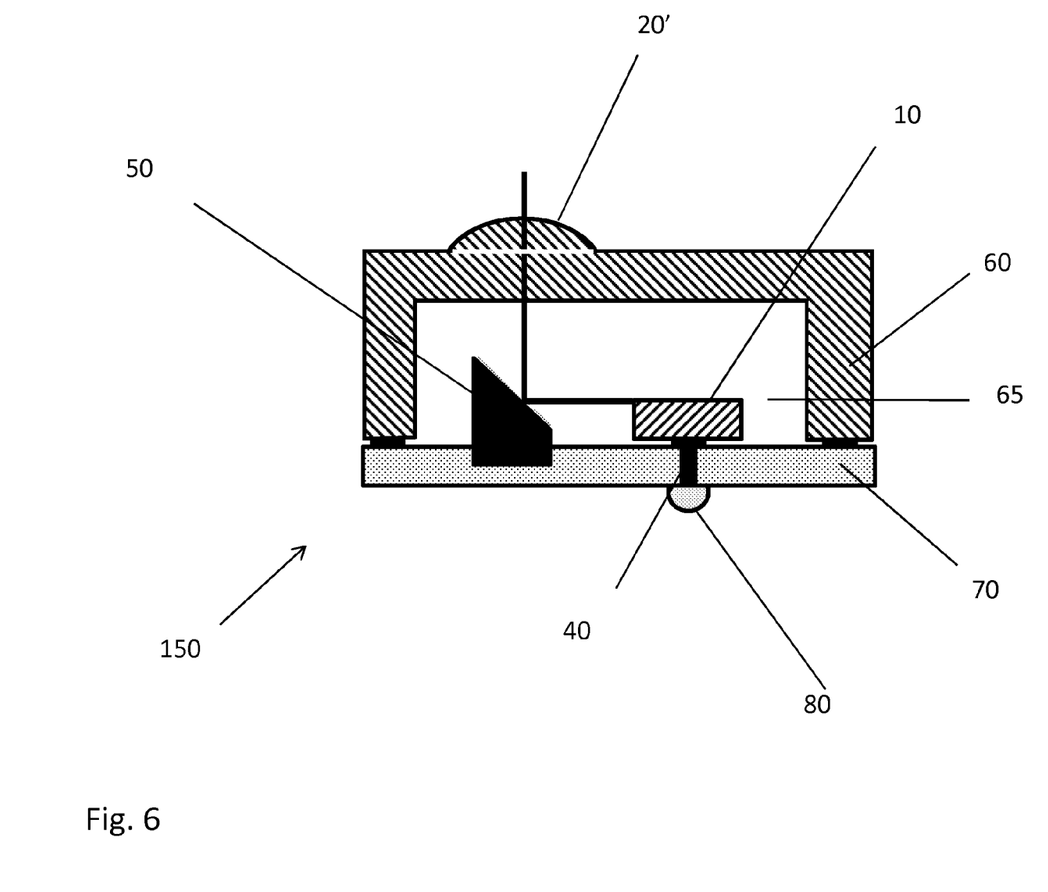
FIG. 6 is a schematic, cross sectional illustration of a fifth embodiment of a microfabricated optical apparatus.

FIG. 6 shows a fifth embodiment of the MEMS silicon optical apparatus, wherein a laser 10 generates a beam of light which is redirected upward by turning mirror 50. This turning mirror 50 directs the light upward through the lid substrate 60. A feature lens 20', may be formed on lid substrate 60 which can shape the beam of light as it passes therethrough. This embodiment is shown lacking some of the components described previously with other embodiments, such as the ball lens, Faraday rotator or isolator, and driver. It should be understood that these additional components may optionally be supplied with this embodiment as well. In FIG. 6, a horizontal line at the base of the lens 20' may suggest that lens 20' is a separate, distinct element. It should be understood that this horizontal line may be an artifact of the rendering of the illustration, and that lens 20' may be formed from a monolithic piece of silicon as described below.

The feature lens 20' may be formed using grey scale lithography, which makes use of When the grayscale exposed resist is used in an etching process such as the one used to make lens 20', the thin areas of the grayscale resist are removed early on, leading to relatively deeply etched features. The thicker areas of resist persist through the etching step, leading to shallowly etch features. Accordingly, the dome-shaped lens 20' is produced by having thin portions of the grayscale resist cover the horizontal surface of the substrate, and the thickest areas over the top of the dome of the lens 20'

Grayscale lithography may be used to form a lens 20' on either the outer surface or the inner surface of the roof of the device cavity lid substrate. A lens 20' is shown on the outer surface in FIG. 7. Accordingly, the microfabricated optical apparatus may include a beam shaping element which is a lens formed in a roof of the device cavity.

In this embodiment the ball lens is not needed, because its function is replace by that of the feature lens on the lid. Additionally the Faraday rotator can be employed external to the TOSA (not shown) since many of the reflective surfaces have been eliminated. As in the previous embodiments, the laser may be driven by through substrate vias 40, which may improve the high frequency characteristics of the device. The embodiment shown in FIG. 6 is shown lacking some of the components described previously with other embodiments, such as the ball lens, Faraday rotator or isolator, and driver. It should be understood that these additional components may optionally be supplied with this embodiment as well. The lens 20' may serve to shape, focus or collimate the light emitted from light source 10 as driven through the through silicon via (TSV).

Figure 7:
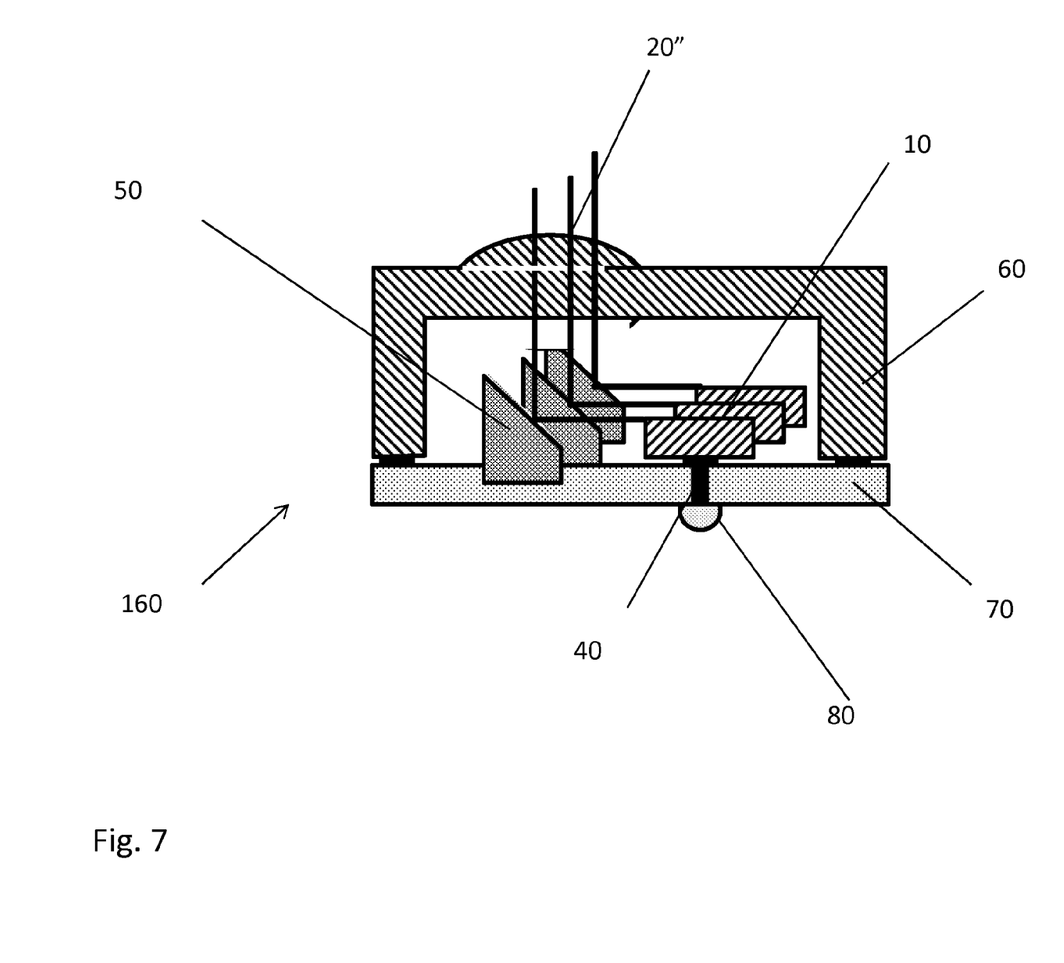
FIG. 7 is a schematic, cross sectional illustration of a sixth embodiment of a microfabricated optical apparatus with a plurality of light sources.

FIG. 7 shows a sixth embodiment of the MEMS optical apparatus, wherein a plurality of lasers 10 each generate a beam of light which is redirected by turning mirrors 50. These turning mirrors 50 may direct the light in the same or different directions as the other light sources. One or more feature lenses 20", may be formed on lid substrate 60 which can shape the beams of light as they pass through. Also in this embodiment, a plurality of TSV's is employed so that each light source can be driven independently of the others, thus multiplying the effective data rate of this device by the number of light sources. This embodiment is shown lacking some of the components described previously with other embodiments, such as the ball lens, Faraday rotator or isolator, and driver. It should be understood that these additional components may optionally be supplied with this embodiment as well. As shown in FIG. 7, the methods described here may be capable of manufacturing microfabricated optical apparatuses, wherein a plurality of light sources may be disposed in a single, compact, device cavity, along with the associated components.

The through silicon vias (TSVs) 40 which are shown in each of FIGS. 2-7 may be made by a number of techniques. In one approach, blind via holes are etched into the front side of a silicon substrate, but not extending through the thickness, such that material remains on the backside of the substrate. An insulating layer, for example, silicon dioxide $SiO_2$ may then be grown on the bare silicon walls within the hole. A plating seed layer may then be deposited conformally in the hole. A conductive material such as copper, may then be plated into the hole. Following the hermetic bonding of the lid wafer to the Si substrate, the remaining material may be removed from the backside of the substrate to expose the copper by, for example, grinding. The conductive copper may thereby extend through the thickness of the substrate 70. Additional details as to this method of making through silicon vias may be found in co-owned U.S. Pat. No. 7,233,048, which is incorporated by reference in its entirety.

Other methods may be used to form the vias, and some may be more appropriate for some substrate materials than others. These alternative methods may be found in, for example, U.S. patent application Ser. No. 11/482,944, U.S. Pat. No. 8,343,791, U.S. patent application Ser. No. 14/499, 287 and U.S. patent application Ser. No. 13/987,871. Each of these documents in incorporated by reference in their entireties, and each is owned by the owner of the instant invention.

The other optical components may be obtained as discrete devices, and disposed on the fabrication substrate by pick and place machines, similar to those used in printed circuit board manufacture to place components. These discrete optical elements may be held in place by epoxy or glue. The light source 10 may require a conductive bonding material to maintain conductivity with the through silicon via. This conductive bonding material may be, for example, a relatively low temperature gold/tin alloy bond.

As mentioned previously, the lid substrate 60 may have a device cavity 65 etched therein using, for example, deep reactive ion etching (DRIE) or anisotropic etching. Anisotropic etching tends to form sidewalls with a 54.7 degree slope with respect to vertical, whereas DRIE tends to make very sharp, very vertical features. Anisotropic etching may be used on the embodiment shown in FIG. 5, whereas DRIE may be used in the embodiments shown in FIGS. 2, 3, 4, 6 and 7. The 56 degree sidewall angle may be convenient for fabricating a reflective surface in order to direct the radiation out of the cavity.

After fabrication of the lid substrate 60 and placement of the optical elements within the perimeter of the device cavity, the lid substrate 60 may be bonded to the silicon device substrate 70. The bonding material may be, for example, a low temperature metal alloy bond such as gold/indium, which is formed at about 156 centigrade. Additional details as to methods for bonding with a gold and indium alloy may be found in U.S. Pat. No. 7,569,926, incorporated by reference in its entirety.

The embodiments illustrated in FIGS. 2-7 and described above have a number of advantages from a manufacturing perspective. They may be tested in a manufacturing environment with a conventional wafer probe to cull damaged or non-functional die. The design is capable of very high yield in a microfabrication production environment. They each allow integration of multiple lasers in a single device cavity, as was illustrated in FIG. 7.

More generally, a method for fabricating an optical apparatus on a substrate, may include forming a device cavity in a lid wafer, forming a through silicon via through the substrate, disposing a light source driven by a waveform which generates optical radiation on the substrate, and coupling the light source electrically to the through silicon via, disposing a beam shaping element on the substrate, disposing a turning surface which redirects the beam of light, and bonding the substrate to the lid wafer to encapsulate the optical apparatus in a substantially hermetic device cavity.

The method may further include etching a blind trench into a front side of the substrate leaving residual substrate material, coating the trench with an insulating material, depositing a conductive material in the blind trench, and removing the residual substrate material from a backside of the substrate to form the via. Even further, the method may include bonding the substrate to the lid wafer with a low temperature metal alloy bond.

The method may also include forming the device cavity with anisotropic etching, leaving inclined sidewalls in the device cavity inclined at angles of about 50 to 60 degrees with respect to a surface of the lid wafer, and depositing a reflective surface onto at least one inclined sidewall of the device cavity.

Finally, the method may include forming a lens in a roof of the device cavity, on an inside or an outside surface.

Figure 8:
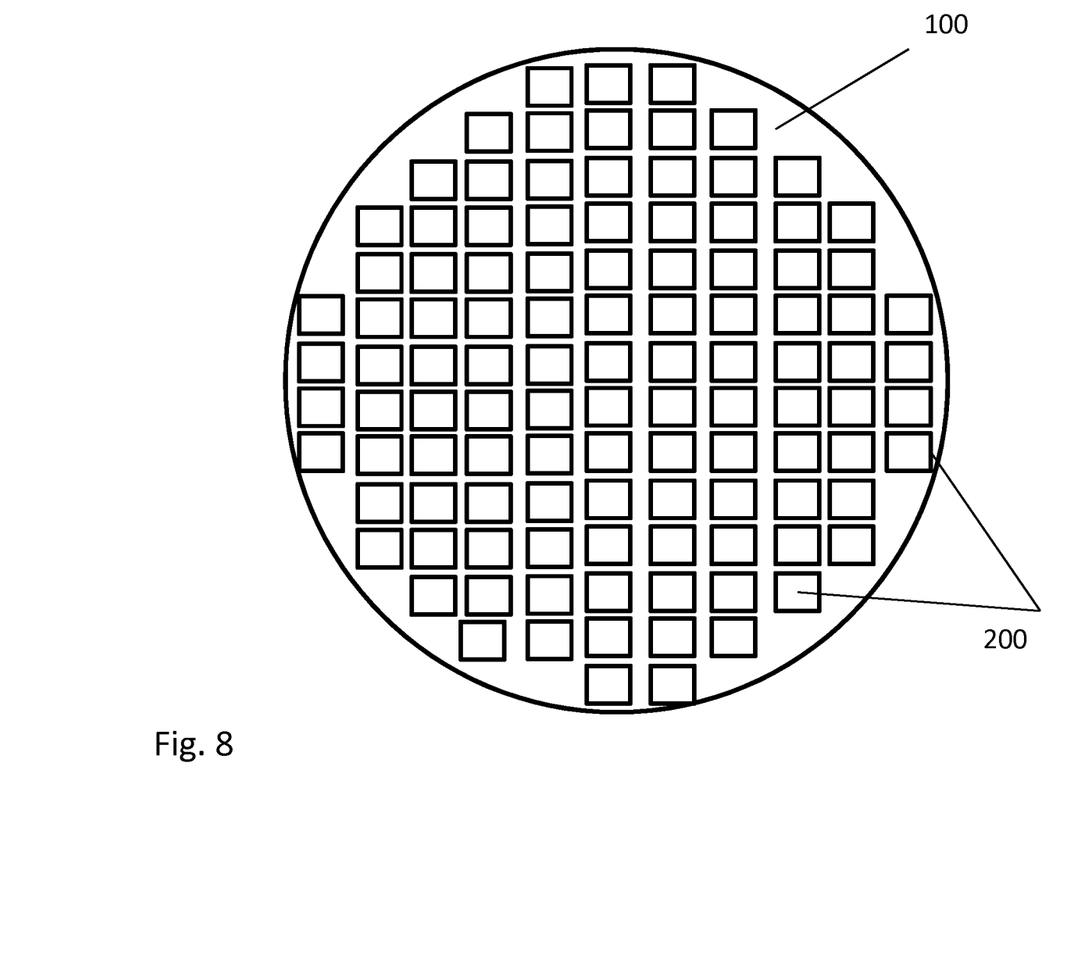
FIG. 8 is a plan view of a substrate with multiple optical apparatuses fabricated thereon.

FIG. 8 is a simplified plan view of a fabrication substrate during processing in a manufacturing environment. As was described previously, the manufacturing method may be capable of fabricating a large number of like devices on a single fabrication substrate 100. These devices may each be microfabricated optical apparatuses 200. This fabrication substrate may be bonded to a lid substrate (not shown) with cavities and perhaps other structures previously formed therein, and registered with the optical apparatuses 200, to form a two-substrate assembly. The individual devices may they be singulated by sawing, dicing or grinding.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A method for fabricating an optical apparatus on a substrate, comprising:
    forming a device cavity in a lid wafer;
    forming a through silicon via through the substrate;
    disposing a light source driven by a waveform which generates optical radiation on the substrate, and coupling the light source electrically to the through silicon via;
    disposing a beam shaping element on the substrate;
    disposing a turning surface which redirects the beam of light;
    bonding the substrate to the lid wafer to encapsulate the optical apparatus in a substantially hermetic device cavity, wherein forming the through silicon via comprises:
    etching a blind trench into a front side of the substrate leaving residual substrate material;
    coating the trench with an insulating material;
    depositing a conductive material in the blind trench; and
    removing the residual substrate material from a backside of the substrate to form the via.

2. The method of claim 1, wherein bonding the substrate to the lid wafer comprises bonding the substrate to the lid wafer with a low temperature metal alloy bond.

3. The method of claim 1, further comprising: forming a lens in a roof of the device cavity, on an outside surface.

4. The method of claim 1, further comprising:
    forming a lens in a roof of the device cavity, on an inside surface.

5. The method of claim 1, wherein forming the device cavity comprises forming the device cavity with anisotropic etching, leaving inclined sidewalls in the device cavity inclined at angles of about 50 to 60 degrees with respect to a surface of the lid wafer.

6. The method of claim 5, further comprising:
    depositing a reflective surface onto at least one inclined sidewall of the device cavity.

* * * * *